United States Patent
Kim et al.

(10) Patent No.: US 7,939,848 B2
(45) Date of Patent: May 10, 2011

(54) LED PACKAGE

(75) Inventors: Do Hyung Kim, Suwon-si (KR); Suk Jin Kang, Seoul (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 102 days.

(21) Appl. No.: 12/438,069

(22) PCT Filed: Jul. 4, 2007

(86) PCT No.: PCT/KR2007/003250
§ 371 (c)(1),
(2), (4) Date: Feb. 19, 2009

(87) PCT Pub. No.: WO2008/150042
PCT Pub. Date: Dec. 11, 2008

(65) Prior Publication Data
US 2010/0163918 A1     Jul. 1, 2010

(30) Foreign Application Priority Data
Jun. 5, 2007  (KR) .......................... 10-2007-0055144

(51) Int. Cl.
*H01L 33/00* (2010.01)
(52) U.S. Cl. .............................. 257/99; 257/98; 257/100
(58) Field of Classification Search ............. 257/98–100
See application file for complete search history.

(56) References Cited

U.S. PATENT DOCUMENTS
| | | | |
|---|---|---|---|
| 2002/0057057 A1* | 5/2002 | Sorg | 313/512 |
| 2002/0079506 A1* | 6/2002 | Komoto et al. | 257/99 |
| 2005/0236638 A1* | 10/2005 | Tsukagoshi | 257/99 |
| 2007/0018558 A1* | 1/2007 | Chua et al. | 313/485 |
| 2008/0121921 A1* | 5/2008 | Loh et al. | 257/99 |

FOREIGN PATENT DOCUMENTS
| | | |
|---|---|---|
| JP | 2001-518692 | 10/2001 |
| JP | 2003-174200 | 6/2003 |
| JP | 2007-027535 | 2/2007 |
| KR | 10-2004-0104178 | 12/2004 |
| KR | 10-0593945 | 6/2006 |

\* cited by examiner

*Primary Examiner* — Wai-Sing Louie
*Assistant Examiner* — Bilkis Jahan
(74) *Attorney, Agent, or Firm* — H.C. Park & Associates, PLC

(57) ABSTRACT

The present invention relates to an LED package including a lead frame including a chip attaching portion with at least one LED chip attached thereto and a plurality of terminal portions each having a width narrower than the chip attaching portion, and a housing for supporting the lead frame. The plurality of terminal portions include at least one first terminal portion extending from a portion of a width of the chip attaching portion, and a plurality of second terminal portions spaced apart from the chip attaching portion.

9 Claims, 2 Drawing Sheets

LED PACKAGE

CROSS REFERENCE TO RELATED APPLICATIONS

This application is the National Stage of International Application No. PCT/KR2007/003250, filed Jul. 4, 2007, and claims priority from and the benefit of Korean Patent Application No. 10-2007-0055144, filed on Jun. 5, 2007, which are both hereby incorporated by reference for all purposes as if fully set forth herein.

BACKGROUND OF THE INVENTION

1. Field of the Invention

The present invention relates to an LED package, and more particularly, to an LED package having a lead frame structure with improved heat radiation performance, improved light reflection performance, improved electrical performance, improved moisture-proof performance and the like.

2. Discussion of the Background

An LED (Light Emitting Diode) is a device in which electrons and holes are recombined at a P-N junction to emit light when a current is applied thereto. Such an LED is generally fabricated into a package structure having an LED chip mounted thereto, and is frequently called an "LED package." The LED package is configured to perform a light-emitting operation using a current applied thereto from the outside.

The LED package includes a lead frame for applying a current to an LED chip, and a housing for supporting the lead frame. In addition, the LED package may further comprise a light-transmissive encapsulant formed in a cavity of the housing to protect the LED chip from the external environment.

In an LED package, heat generated from an LED chip has a bad influence on the light emitting performance and life span of the LED package. This is because dislocation and mismatch occur in the crystalline structure of the LED chip in a case where the heat generated from the LED chip remains in the LED chip for a long period of time. Therefore, an LED package has been developed having a heat radiation means such as a heat sink additionally mounted at a position to which an LED chip is attached. However, the aforementioned LED package has a problem in that the structure thereof is complicated and the manufacturing costs thereof are increased since an additional component such as a heat sink should be installed.

Conventionally, an LED package structure has been developed, in which an LED chip is directly attached to one region of a lead frame and at least three terminal portions are branched off from the region of the lead frame to which the LED chip is attached. Such an LED package has been disclosed in Japanese Patent Laid-open Publication No. 2001-518692. However, in the disclosed conventional technology, a chip attaching region of a lead frame is reduced due to the structure in which three or more terminal portions are branched off from the chip attaching region. The reduction of the chip attaching region results in reducing an area of a region for reflecting light advancing backward from an LED chip, and thus, in degrading light reflection performance of the lead frame. Further, there is another problem in that the adaptability for an LED package having a plurality of LED chips mounted therein is reduced.

Meanwhile, in an LED package, a path through which moisture is penetrated around an LED chip in a housing from the outside of the housing along boundary surfaces between a lead frame and the housing and between the housing and an encapsulant is inevitably produced. Therefore, the penetration of moisture mainly causes the degradation in performance and life span of the LED package. Moreover, the lead frame is required to be bent near an outer surface of the housing. When bending the lead frame, therefore, the housing may be damaged or a gap between the lead frame and the housing may be further increased. The damage of the housing and the increase of the gap may cause moisture to more easily penetrate into the interior of the housing. Further, when bending the lead frame, a wire connected between a portion of the lead frame and the LED chip may be broken.

SUMMARY OF THE INVENTION

An object of the present invention is to provide an LED package, wherein a lead frame is configured to have a chip attaching portion with LED chips attached thereto, which is considerably wider than each of a plurality of terminal portions, so that the LED package with improved heat radiation, light reflection and electrical performances can be simply and easily manufactured.

Another object of the present invention is to provide an LED package including a structure in which a chip attaching portion is formed to be wider than a plurality of terminal portions and moisture can be prevented from being penetrated around an LED chip mounted to the chip attaching portion.

A further object of the present invention is to provide an LED package including a lead frame configured to avoid several problems caused when bending the lead frame.

According to an aspect of the present invention, there is provided an LED package, which comprises a lead frame formed by cutting and bending a metal plate and including a chip attaching portion with at least one LED chip attached thereto and a plurality of terminal portions each having a width narrower than the chip attaching portion; and a housing for supporting the lead frame, wherein the plurality of terminal portions include at least one first terminal portion extending from a portion of a width of the chip attaching portion, and a plurality of second terminal portions spaced apart from the chip attaching portion.

Preferably, the plurality of terminal portions may include two first terminal portions extending from one side of the chip attaching portion and two second terminal portions spaced apart from the other side of the chip attaching portion.

Preferably, the lead frame may have a moisture shield positioned at a surface thereof brought into contact with the housing to prevent moisture from being penetrated from the outside of the housing. At this time, the moisture shield may be either a hole formed in the lead frame in which a portion of the housing is fitted, or a wall which protrudes from the surface of the lead frame and is brought into contact with the housing.

Preferably, the housing comprises a cavity in which an encapsulant for encapsulating the LED chip, and a moisture shielding wall engaged with the encapsulant for preventing moisture penetration is formed in an inner wall of the cavity. Preferably, each of the plurality of terminal portions is formed with a bent portion near an external surface of the housing, and the bent portion is formed with a V-shaped notch.

According to an embodiment of the present invention, a lead frame is configured to have a chip attaching portion with LED chips attached thereto which is considerably wider than each of a plurality of terminal portions, and thus, an LED package with improved heat radiation, light reflection and electrical performances can be implemented in a very simple way. Further, according to the embodiment of the present invention, a phenomenon that moisture is penetrated into the LED package is prevented, and thus, the resultant degradation in life span and performance of the LED package can be prevented. Furthermore, the damage of the housing, further increase of moisture penetration due to the housing damage and wire breakage between the lead frame and the LED chip, which are caused when the lead frame is bent, can be prevented.

DETAILED DESCRIPTION OF THE ILLUSTRATED EMBODIMENTS

Hereinafter, preferred embodiments of the present invention will be described in detail with reference to the accompanying drawings.

Figure 1:
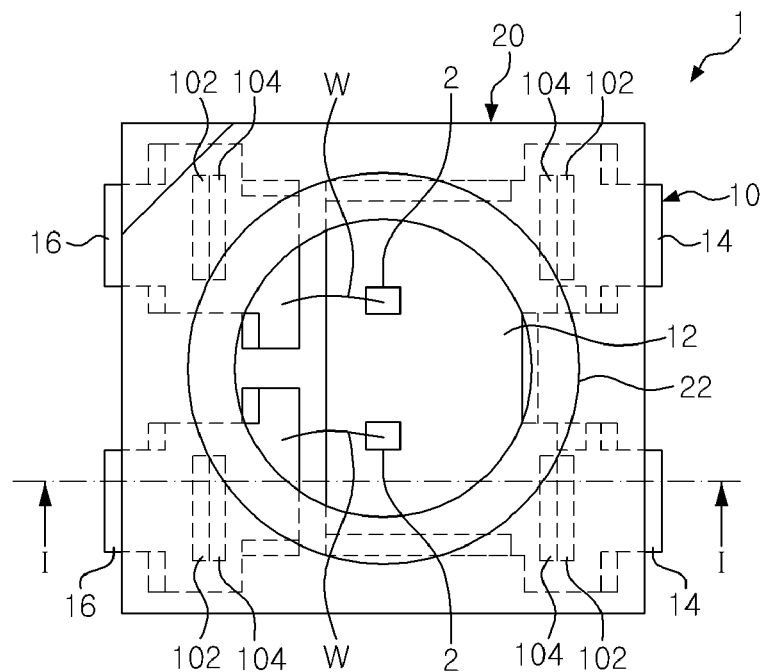
FIG. 1 is a plan view of an LED package according to an embodiment of the present invention.
Figure 2:
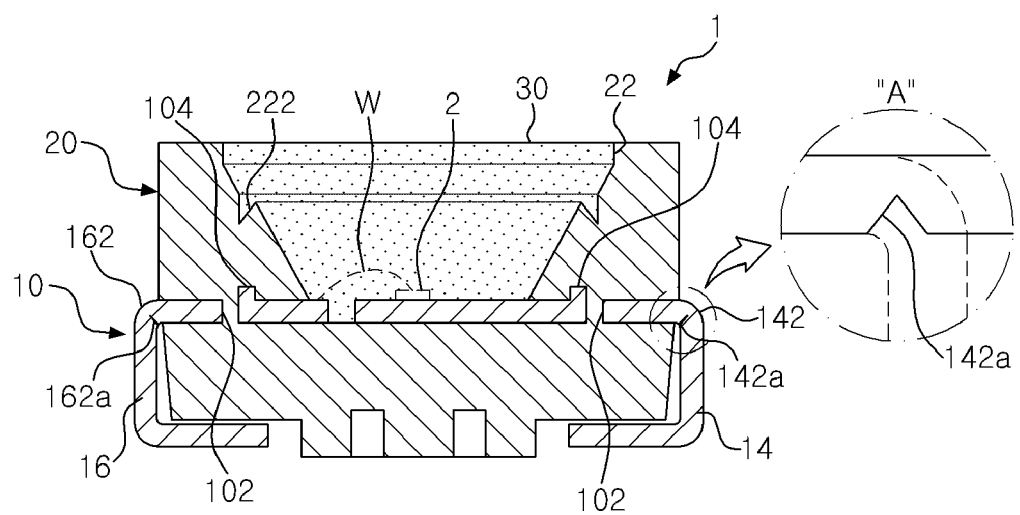
FIG. 2 is a sectional view taken along line I-I of FIG. 1.
Figure 3:
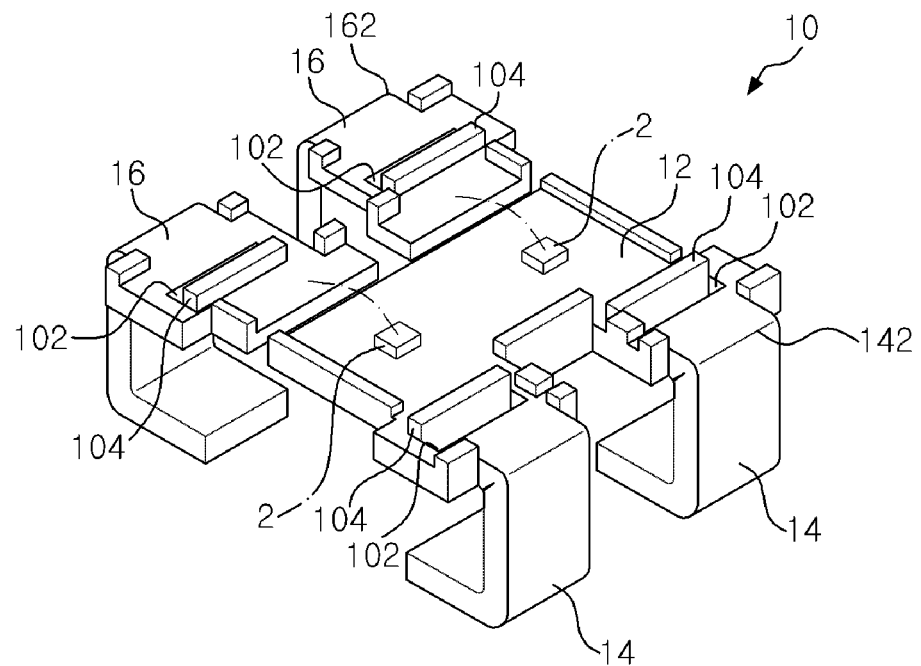
FIG. 3 is a perspective view of a lead frame mounted in the LED package shown in FIGS. 1 and 2.

FIG. 1 is a plan view of an LED package according to an embodiment of the present invention, FIG. 2 is a sectional view taken along line I-I of FIG. 1, and FIG. 3 is a perspective view of a lead frame mounted in the LED package shown in FIGS. 1 and 2.

Referring to FIGS. 1 and 2, the LED package 1 according to this embodiment includes a lead frame 10 and a housing 20 formed to support the lead frame 10. Further, the LED package 1 includes two LED chips 2 each of which receives a current applied from the outside of the LED package through the lead frame 10 to emit light.

The lead frame 10 includes a chip attaching portion 12 with the LED chips 2 attached thereto, two first terminal portions 14 extending integrally from the chip attaching portion 12, and two second terminal portions 16 spaced apart from the chip attaching portion 12. The whole of the chip attaching portion 12 and some portions of the first and second terminal portions 14 and 16 are surrounded by the housing 20. The first and second terminal portions 14 and 16 extend from the inside of the housing 20 to the outside of the housing 20.

The two LED chips 2 are connected to the two second terminal portions 16 through bonding wires W. The first terminal portion 14 integrally formed with the chip attaching portion 12 is a common terminal, and each of the two second terminal portions 16 spaced apart from the chip attaching portion 12 is an individual terminal, so that the two LED chips 2 can separately perform light emitting operations. At this time, one LED chip may be mounted on the chip attaching portion 12.

In the embodiment of the present invention, the housing 20 is formed of a polyphthalamide (PPA) resin, for example, through a molding process and is provided with a cavity 22 for through which the LED chip 2 attached to the chip attaching portion 12 can be exposed upward. Further, an encapsulant 30 (shown only in FIG. 2) made of an epoxy or silicone resin, for example, to protect the LED chip 2 from the outside is formed in the cavity 22. The encapsulant 30 may contain phosphors for the conversion of light emitted from the LED chip 2.

Referring to FIG. 3, the lead frame 10 of this embodiment is formed by cutting and bending a metal plate to form the chip attaching portion 12 and the first and second terminal portions 14 and 16. A single chip attaching portion 12 and the two second terminal portions 16 are spaced apart from each other through the aforementioned cutting process. Further, the two first terminal portions 14 extend integrally from the chip attaching portion 12. In addition, the first and second terminal portions 14 and 16 are configured into a general "⊏" shape through the aforementioned bending process. Assuming that the lead frame 10 has not been cut, it can be seen that the first and second terminal portions 14 and 16 are portions corresponding to portions of widths at both side ends of the chip attaching portion 12. Further, the first and second terminal portions 14 and 16 are positioned opposite to each other.

The configuration of the lead frame 10 shown in FIG. 3 will be discussed. The chip attaching portion 12 has a width approximately two times greater than that of the first or second terminal portion 14 or 16. Therefore, the chip attaching portion has a wide surface area with superior heat radiation and light reflection performance. At this time, the light reflection performance is improved due to an increased area onto which light directed backward from the LED chip 2 is reflected. Further, the two first terminal portions 14 extend integrally to the outside of the housing 20 (See FIGS. 1 and 2) from the chip attaching portion 12, and thus, the lead frame has superior heat radiation performance as compared to a case where only one terminal portion is formed. Furthermore, even in view of electrical performance, one LED chip may be operated, and the two LED chips 2 may also be operated simultaneously or separately.

The aforementioned configuration of the lead frame 10 for enhancing all of the heat radiation, light reflection and electrical performances can be easily implemented through a simple process of cutting and bending a metal plate, i.e. forming the two integrally formed terminal portions 14 at one side of the chip attaching portion 12 and the two separated terminal portions 16 at the other side of the chip attaching portion.

Referring to FIGS. 1 to 3, a plurality of moisture shields 102 and 104 for preventing moisture from being penetrated from the outside of the housing 20 are provided at a surface of the lead frame 10 brought into contact with the housing 20. Since the lead frame 10 is configured to extend from the inner side to the outer side of the housing 20, the surface of the lead frame 10 becomes a moisture penetration path extending from the inner side to the outer side of the housing 20. Thus, if a structure for blocking the moisture penetration path is provided on the surface of the lead frame 20, the penetration of moisture into the inner side of the housing 20 can be greatly reduced.

The moisture shield includes a plurality of moisture shielding holes 102 formed in the lead frame 10 and a plurality of moisture shielding walls 104 protruding from the surface of the lead frame 10. Since a portion of the housing 20 is fitted in the hole 102, the fitted portion of the housing 20 functions as a wall for blocking the moisture penetration path. Further, each of the walls 104 serves to block the moisture penetration path. Furthermore, the wall 104 also functions as a heat radiation fin for facilitating the heat radiation. In this embodiment, the moisture shielding holes 102 and walls 104 are mainly formed in the first and second terminal portions 14 and 16 corresponding to an important moisture penetration path from the inner side to the outer side of the housing 20. Moreover, the moisture shielding holes 102 and walls 104 can allow adhesive strength between the housing 20 and the lead frame 10, which are formed through a resin molding process, to be further increased. Accordingly, the moisture penetration can be greatly prevented due to the increase of the adhesive strength.

Referring to FIG. 2, the LED package 1 of this embodiment further comprises a moisture shielding wall 222 which is formed on an inner inclined surface of the cavity 22 in the housing 20 and is engaged with the encapsulant 30 in the cavity 22. The moisture shielding wall 222 is formed into an annular shape along an inner circumference of the cavity 22 on the inner inclined surface of the cavity 22 and protrudes sharply from the inner inclined surface of the cavity. One of the moisture penetration paths into the LED package 1 is a gap between the housing 20 and the encapsulant 30 within the cavity 22. The moisture shielding wall 222 serves to entirely block the moisture penetration path between the housing 20 and the encapsulant 30. In this embodiment, although the moisture shielding wall 222 is formed into an annular shape protruding sharply from the inner inclined surface of the cavity, the water shielding wall 222 may be configured to include a plurality of sharply protruding portions so that the respective sharply protruding portions are engaged with the encapsulant 30.

Further, the first and second terminal portions 14 and 16 of the lead frame 10 include bent portions 142 and 162 bent at about 90 degrees around an external surface of the housing 20, respectively. In addition, roughly V-shaped notches 142a and 162a are formed before the bending process is performed. A state where the first or second terminal portion 14 or 16 is bent adjacent to the notch 142a or 162a is illustrated in a circle "A" of FIG. 2. Due to the notches 142a and 162a, the bent portions 142 and 162 can be easily formed without damage to the housing 20, when the first and second terminal portions 14 and 16 are bent. Further, due to the V-shaped notches 142a and 162a, it is possible to prevent an unnecessary force from being applied to the lead frame 10 when bending the terminal portions 14 and 16. Therefore, it is possible to prevent the wire W from being cut from the lead frame 12 due to the force generated in the above bending process.

Figure 4:
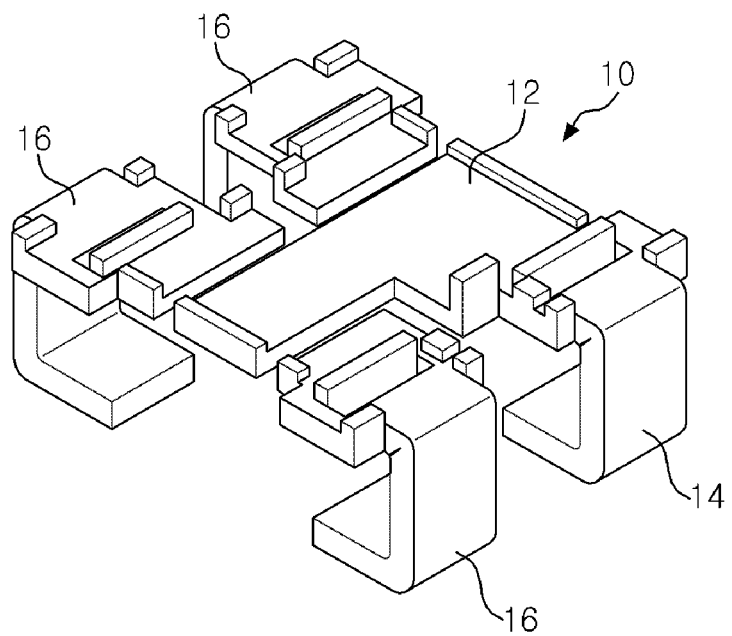
FIG. 4 is a perspective view of a lead frame according to another embodiment of the present invention.

FIG. 4 is a perspective view of a lead frame according to another embodiment of the present invention. The lead frame 10 shown in FIG. 4 is different from the lead frame of the previous embodiment in that three second terminal portions 16 are spaced apart from a chip attaching portion 12. Further, since there are three second terminal portions 16, a single first portion 14 integrally formed with the chip attaching portion 12 is employed. Two of the three second terminal portions 16 are positioned adjacent to each other at one side of the chip attaching portion 12 similarly to the previous embodiment, and the other second terminal portion 16 is positioned adjacent to the first terminal portion 14 at the opposite side to the two second terminal portions 16.

In the lead frame 10 shown in FIG. 4, three LED chips are connected to the three second terminal portions 16 through wires in a state where the three LED chips are attached to the chip attaching portion 12, so that the three LED chips can be individually operated. If it is not considered that the LED chips are individually operated, at least one or more LED chips may be mounted in the lead frame 10.

The invention claimed is:

1. An LED package, comprising:
   a lead frame comprising a chip attaching portion comprising at least one LED chip attached thereto and a plurality of terminal portions each having a width narrower than the chip attaching portion; and
   a housing for supporting the lead frame,
   wherein the plurality of terminal portions comprise at least one first terminal portion extending from a portion of a width of the chip attaching portion, and a plurality of second terminal portions spaced apart from the chip attaching portion,
   wherein the lead frame comprises a moisture shield arranged on a surface thereof,
   wherein the moisture shield comprises a wall protruding from the surface of the lead frame and contacting the housing.

2. The LED package as claimed in claim 1, wherein the plurality of terminal portions comprise two first terminal portions extending from one side of the chip attaching portion and two second terminal portions spaced apart from the other side of the chip attaching portion.

3. The LED package as claimed in claim 1, wherein the moisture shield further comprises a hole formed in the lead frame in which a portion of the housing is arranged.

4. The LED package as claimed in claim 1, wherein the housing comprises a cavity in which an encapsulant is disposed, and a moisture shielding wall contacting the encapsulant and arranged in an inner wall of the cavity.

5. The LED package as claimed in claim 1, wherein each terminal portion comprises a bent portion arranged near an external surface of the housing, and the bent portion comprises a V-shaped notch.

6. The LED package as claimed in claim 1, wherein the plurality of terminal portions comprise one first terminal portion extending from the chip attaching portion and three second terminal portions spaced apart from the chip attaching portion.

7. The LED package as claimed in claim 1, wherein the plurality of terminal portions comprise a width approximately half that of the chip attaching portion.

8. The LED package as claimed in claim 1, wherein at least one terminal portion extends from an inside part of the housing to an outside part of the housing.

9. The LED package as claimed in claim 4, wherein the inner wall of the cavity is inclined, and the moisture shielding wall protrudes from the inclined inner wall of the cavity.

* * * * *